(12) United States Patent
Onishi et al.

(10) Patent No.: US 8,897,096 B2
(45) Date of Patent: Nov. 25, 2014

(54) OSCILLATOR AND ELECTRONIC DEVICE

(75) Inventors: Yasuharu Onishi, Tokyo (JP); Jun Kuroda, Tokyo (JP); Motoyoshi Komoda, Tokyo (JP); Yuichiro Kishinami, Tokyo (JP); Yukio Murata, Tokyo (JP); Shigeo Satou, Tokyo (JP); Tatsuya Uchikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/697,990

(22) PCT Filed: Jul. 14, 2011

(86) PCT No.: PCT/JP2011/004036
§ 371 (c)(1),
(2), (4) Date: Nov. 14, 2012

(87) PCT Pub. No.: WO2012/011257
PCT Pub. Date: Jan. 26, 2012

(65) Prior Publication Data
US 2013/0064041 A1    Mar. 14, 2013

(30) Foreign Application Priority Data

Jul. 23, 2010    (JP) ................. 2010-166550

(51) Int. Cl.
*G01S 15/08*    (2006.01)
*H01L 41/08*    (2006.01)
*H04R 3/00*    (2006.01)
*H04R 17/00*    (2006.01)
*H01L 41/09*    (2006.01)
*H04R 1/40*    (2006.01)

(52) U.S. Cl.
CPC *H01L 41/09* (2013.01); *H04R 3/00* (2013.01); *H04R 17/00* (2013.01); *H04R 1/403* (2013.01)
USPC .............................. 367/140; 367/137

(58) Field of Classification Search
CPC ...... B06B 1/0648; G06F 3/016; H04R 17/00; H04R 7/10; H04R 2217/03; H04R 2499/11; H04R 3/00; H04R 1/403; H01L 41/09
USPC ................................. 367/99, 137, 140
See application file for complete search history.

(56) References Cited

U.S. PATENT DOCUMENTS 3,964,013 A  *  6/1976  Konrad ........................... 367/92
4,823,908 A      4/1989  Tanaka et al.
(Continued)

FOREIGN PATENT DOCUMENTS

EP    0993231 A2    4/2000
GB    2443228 A     4/2008
(Continued)

OTHER PUBLICATIONS

Search Report dated Oct. 4, 2013, issued by the European Patent Office in counterpart European Application No. 11809433.3.

*Primary Examiner* — Daniel Pihulic
(74) *Attorney, Agent, or Firm* — Sughrue Mion, PLLC

(57) ABSTRACT

In an oscillator (100), a plurality of piezoelectric vibrators (111 to 113) supported by vibrator support mechanisms (120) individually output highly directional sound waves. The plurality of piezoelectric vibrators (111 to 113) is formed by dividing a laminated body of an elastic member and a piezoelectric substance by the vibrator support mechanisms (120). Since it is not necessary to arrange the plurality of piezoelectric vibrators in a matrix, the entirety of a device can be small-sized. A sound deflection unit that deflects a sound wave which is output by at least one of the piezoelectric vibrators may be further included.

10 Claims, 4 Drawing Sheets

(56) References Cited

U.S. PATENT DOCUMENTS

| | | |
|---|---|---|
| 2005/0139013 A1 | 6/2005 | Hashimoto et al. |
| 2010/0280390 A1 | 11/2010 | Hendriks et al. |
| 2013/0043769 A1* | 2/2013 | Onishi et al. .................. 310/334 |
| 2013/0064041 A1* | 3/2013 | Onishi et al. .................... 367/99 |
| 2013/0201796 A1* | 8/2013 | Onishi et al. .................... 367/99 |
| 2013/0216069 A1* | 8/2013 | Onishi et al. .................. 381/190 |
| 2013/0223657 A1* | 8/2013 | Onishi et al. .................... 367/99 |
| 2013/0242702 A1* | 9/2013 | Onishi et al. .................... 367/99 |
| 2013/0243224 A1* | 9/2013 | Onishi et al. .................. 381/190 |
| 2013/0257551 A1* | 10/2013 | Onishi et al. .................. 331/155 |
| 2013/0257552 A1* | 10/2013 | Onishi et al. .................. 331/155 |

FOREIGN PATENT DOCUMENTS

| | | | |
|---|---|---|---|
| JP | 61-264995 | A | 11/1986 |
| JP | 3-270282 | A | 12/1991 |
| JP | 4-74099 | A | 3/1992 |
| JP | 5-259525 | A | 10/1993 |
| JP | 2007/026736 | A1 | 3/2007 |
| JP | 2007/083497 | A1 | 7/2007 |
| JP | 2007-237831 | A | 9/2007 |
| JP | 2010-515522 | A | 5/2010 |
| JP | 2012015765 | A * | 1/2012 |
| WO | 2004/098234 | A1 | 11/2004 |
| WO | 2010/041394 | A1 | 4/2010 |
| WO | WO 2012011257 | * | 1/2012 |

* cited by examiner

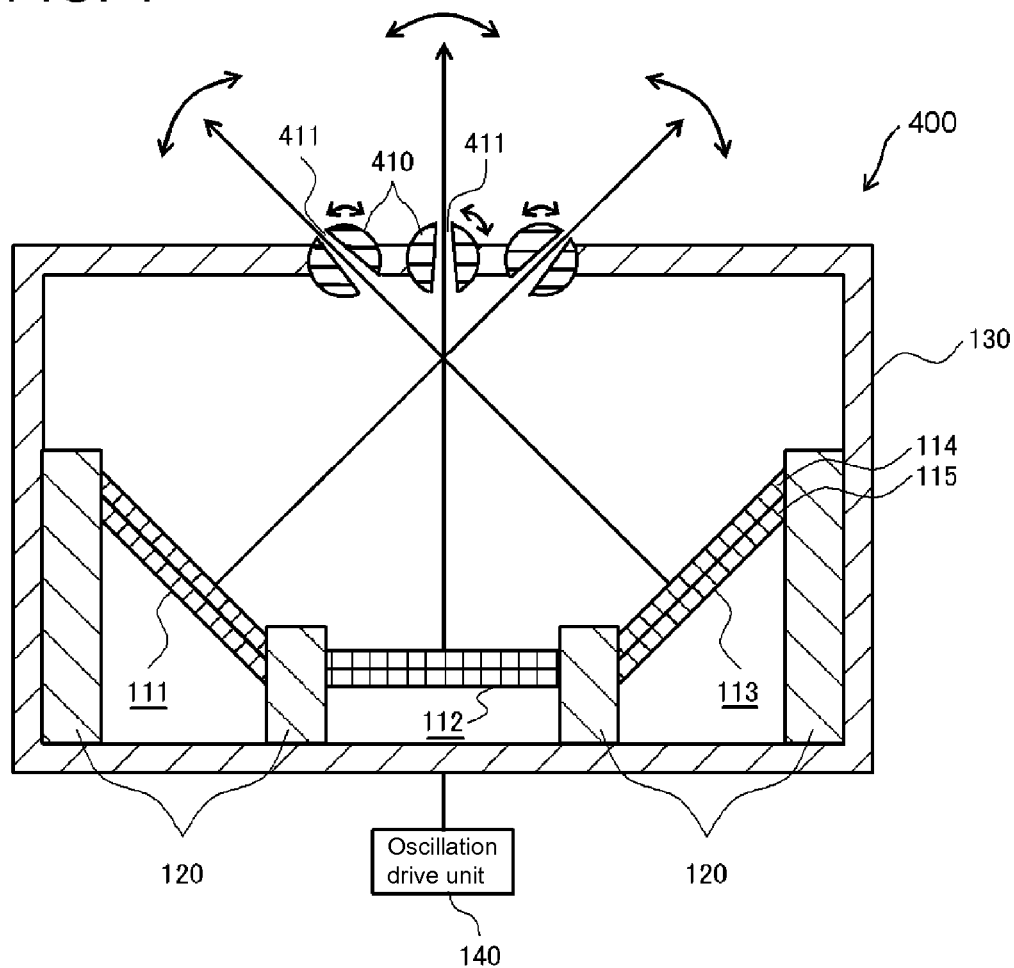

OSCILLATOR AND ELECTRONIC DEVICE

CROSS REFERENCE TO RELATED APPLICATIONS

This application is a National Stage of International Application No. PCT/JP2011/004036, filed on Jul. 14, 2011, which claims priority from Japanese Patent Application No. 2010-166550, filed on Jul. 23, 2010, the contents of all of which are incorporated herein by reference in their entirety.

TECHNICAL FIELD

The present invention relates to an oscillator including a piezoelectric element, and particularly relates to an oscillator in which a piezoelectric element is mounted onto a vibration member, and an electronic device having the oscillator.

BACKGROUND ART

In recent years, demand for portable electronic devices such as a cellular phone and a notebook computer has grown. In such electronic devices, thin portable terminals having sound functions such as a video phone, a movie play, and a hands-free phone as commodity values have being developed. In the development thereof, the requirements for a high-quality sound and a reduction in size and thickness have increased with respect to an electro-acoustic transducer (speaker) which is an acoustic component.

Presently, in electronic devices such as a cellular phone, an electro-dynamic electro-acoustic transducer has been used as an electro-acoustic transducer. The electro-dynamic electro-acoustic transducer is constituted by a permanent magnet, a voice coil, and a vibrating membrane.

However, the electro-dynamic electro-acoustic transducer has a limit to a reduction in thickness due to the operation principle and the structure thereof. On the other hand, Patent Documents 1 and 2 discloses that a piezoelectric element is used as the electro-acoustic transducer.

In addition, as another example of an oscillator making use of the piezoelectric element, in addition to a speaker, various electronic devices or oscillators such as a sound wave sensor (Patent Document 3) that detects the distance to an object using a sound wave oscillated from the piezoelectric element are known (Patent Document 4).

RELATED DOCUMENT

Patent Document

[Patent Document 1] Japanese Unexamined Patent Application Republication (Translation of PCT Application) No. 2007-026736

[Patent Document 2] Japanese Unexamined Patent Application Republication (Translation of PCT Application) No. 2007-083497

[Patent Document 3] Japanese Unexamined Patent Application Publication No. Hei 03-270282

[Patent Document 4] Japanese Unexamined Patent Application Publication No. Hei 04-074099

DISCLOSURE OF THE INVENTION

An oscillator making use of the piezoelectric element generates a vibration amplitude using a piezoelectric effect of the piezoelectric element. The oscillator making use of the piezoelectric element has an advantage over the above-mentioned electro-dynamic electro-acoustic transducer with respect to a reduction in thickness. However, in the oscillator, since a sound to be output is highly directional, the sound can only be output in one direction.

The present invention is contrived in view of the above-mentioned problems, and an object thereof is to provide an oscillator and an electronic device which are capable of outputting a highly directional sound wave in a plurality of directions.

An oscillator of the invention includes: a plurality of piezoelectric vibrators each of which outputs a sound wave; and a vibrator support mechanism that supports the plurality of piezoelectric vibrators so that output directions of the sound wave are different from each other.

A first electronic device of the present invention includes: the above-mentioned oscillator; and an oscillation drive unit that causes the oscillator to output a highly directional sound wave that is obtained by modulating a low-frequency audible range sound into ultrasonic waves.

A second electronic device of the invention includes: the above-mentioned oscillator; an oscillation drive unit that drives the oscillator to output ultrasonic waves; an ultrasonic wave detection unit that detects the ultrasonic waves reflected from an object to be measured; and a distance calculation unit that calculates a distance to the object to be measured on the basis of the ultrasonic waves detected by the ultrasonic wave detection unit.

According to the oscillator of the present invention, it is possible to output a highly directional sound wave in a plurality of directions.

BRIEF DESCRIPTION OF THE DRAWINGS

The above-mentioned objects, other objects, features and advantages will be made clearer from the preferred embodiments described below, and the following accompanying drawings.

FIG. 4 is a vertical cross-sectional front view schematically illustrating a structure of an electro-acoustic transducer which is an oscillator according to still another modified example.

DESCRIPTION OF EMBODIMENTS

Figure 1:
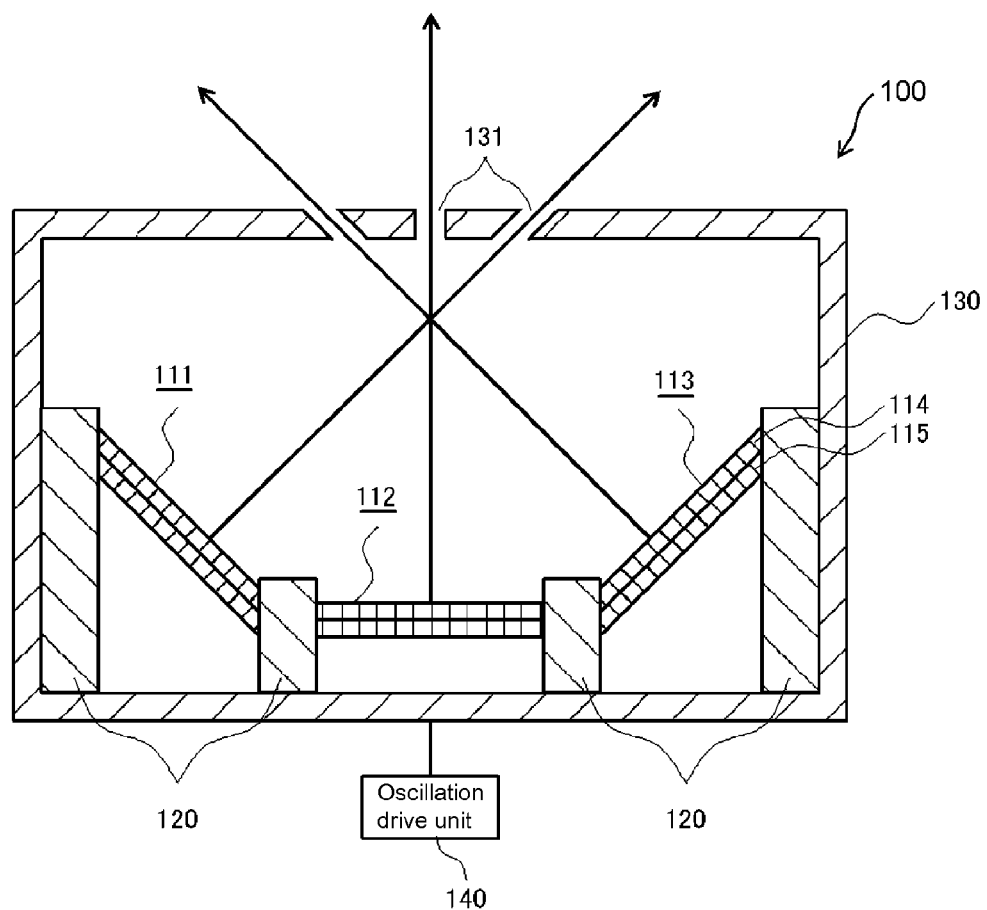
FIG. 1 is a vertical cross-sectional front view schematically illustrating a structure of an electro-acoustic transducer which is an oscillator according to a first embodiment of the present invention.

A first embodiment of the invention will be described with reference to FIG. 1. As shown in FIG. 1, an electro-acoustic transducer 100 which is an oscillator of the embodiment includes a plurality of piezoelectric vibrators 111 to 113 each of which outputs a highly directional sound wave and a vibrator support mechanism 120 that supports the plurality of piezoelectric vibrators 111 to 113 so that output directions of the sound wave are different from each other.

In the electro-acoustic transducer 100, the plurality of piezoelectric vibrators 111 to 113 output a highly directional sound wave obtained by modulating a low-frequency audible range sound into ultrasonic waves. The vibrator support mechanism 120 supports the plurality of piezoelectric vibrators 111 to 113 so that focal positions are different from each other. The focal position herein is a position in which a highly directional sound wave is demodulated into an audible range sound wave.

Further, in the electro-acoustic transducer 100 of the embodiment, a laminated body of one piezoelectric substance 114 and one elastic member 115 is formed, and the vibrator support mechanism 120 divides the laminated body into a plurality of piezoelectric vibrators 111 to 113 by partially constraining the laminated body.

More specifically, in the electro-acoustic transducer 100 of the embodiment, the laminated body of the elastic member 115 and the piezoelectric substance 114 is supported by four vibrator support mechanisms 120 in the longitudinal direction. Two of the vibrator support mechanisms 120 support both ends of the laminated body. For this reason, the laminated body is divided into three piezoelectric vibrators 111 to 113 by the vibrator support mechanisms 120.

In the embodiment, these three piezoelectric vibrators 111 to 113 are formed to have the same total length. The vibrator support mechanisms 120 the surface of the piezoelectric substance 114.

Two vibrator support mechanisms 120 that support both ends of the laminated body are formed to have a larger height than the remaining two vibrator support mechanisms 120. For this reason, in the three piezoelectric vibrators 111 to 113, one surface located at the center is horizontally located, and the two on both sides are inclined so that the surfaces face each other.

The electro-acoustic transducer 100 of the embodiment includes a box-shaped body housing 130, and a plurality of vibrator support mechanisms 120 are fixed to the inside bottom thereof. Three sound holes 131 are formed on the upper surface of the body housing 130. The three sound holes 131 correspond to three piezoelectric vibrators 111 to 113, and let three highly directional sound waves which are output by the piezoelectric vibrators 111 to 113 individually pass through. The body housing 130 serves as a fixed end. The body housing 130 is formed of a material having a high rigidity with respect to the elastic member 115, for example, stainless steel, brass or the like.

In the piezoelectric substance 114, an upper electrode layer and a lower electrode layer are individually formed on both the upper and lower sides of a piezoelectric layer (not shown in figures). An oscillation drive unit 140 is connected to the upper electrode layer and the lower electrode layer through a lead wire. A voltage is applied to the upper electrode layer and the lower electrode layer from the oscillation drive unit 140, and thus the piezoelectric substance 114 outputs a sound wave of an audible region or an ultrasonic wave.

The material constituting the piezoelectric substance 114 of the embodiment is not particularly limited to both an inorganic material and an organic material as long as it is a material having a piezoelectric effect. This material is, for example, a material having high electro-mechanical conversion efficiency, for example, lead Zirco-titanate (PZT), barium titanate (BaTiO3) or the like.

In addition, the thickness of the piezoelectric layer of the piezoelectric substance 114 is not particularly limited, but is preferably equal to or more than 10 μm, and equal to or less than 500 μm. For example, when a thin film which is formed of a ceramic material, which is a brittle material, and has a thickness of less than 10 μm is used as the piezoelectric substance 114, it is possible to occur breakage, damage or the like the piezoelectric substance 114 when handling due to the weakness of the mechanical strength, and thus it is difficult to handle the piezoelectric substance 114.

In addition, when ceramic of which the thickness exceeds 500 μm is used as the piezoelectric substance 114, conversion efficiency from electrical energy to mechanical energy is considerably deteriorated, and thus a sufficient performance as the electro-acoustic transducer 100 is not obtained.

In general, in piezoelectric ceramic generating an electrostrictive effect through an input of the electrical signal, the conversion efficiency depends on the electric field intensity. This electric field intensity is expressed as (input voltage)/(thickness in polarization direction), and thus an increase in the thickness necessarily causes a decrease in the conversion efficiency.

In the piezoelectric substance 114 of the embodiment, the upper electrode layer and the lower electrode layer are formed on a main surface, as mentioned above, in order to generate an electric field. The material of the upper electrode layer and the lower electrode layer is not particularly limited as long as it is a material having electrical conductivity, but it is preferable to use silver or silver/palladium. Silver is used as a low-resistance versatile electrode layer, and thus there is an advantage in manufacturing processes and costs and the like.

In addition, silver/palladium is a low-resistance material excellent in oxidation resistance, and thus has an advantage from the viewpoint of reliability. In addition, the thickness of the upper/lower electrode layers is not particularly limited, but the thickness is preferably equal to or more than 1 μm, and equal to or less than 50 μm.

For example, when the thickness of the upper electrode layer and lower electrode layer is less than 1 μm, these layers cannot be uniformly formed since the thickness of the layers is thin, and thus the conversion efficiency could decrease. Meanwhile, as a technique for forming the upper electrode layer and the lower electrode layer in the form of a thin film, there is a method of applying an electric conductor in the form of a paste.

However, since the surface of the piezoelectric substance 114 is a satin-finished surface when the piezoelectric substance 114 is poly crystal such as ceramic, the wetting state at the time of application is deteriorated, and thus the electrode layer cannot be uniformly formed unless the electrode layer has a certain degree of thickness.

On the other hand, when the film thickness of the upper electrode layer and the lower electrode layer exceeds 100 μm, there is particularly no problem in manufacturing, but the upper electrode layer and the lower electrode layer serve as a constraint surface with respect to the piezoelectric ceramic material constituting a piezoelectric layer, and thus the energy conversion efficiency decreases.

In the piezoelectric substance 114 of the electro-acoustic transducer 100 according to the embodiment, the main surface on one side thereof is constrained by the elastic member 115. In addition, the elastic member 115 simultaneously has a function of adjusting the fundamental resonance frequency of the piezoelectric substance 114. The fundamental resonance frequency f of the mechanical piezoelectric vibrators 111 to 113 depends on load weight and compliance, as expressed in the following expression.

$$f=1/(2\pi L\sqrt{mc}) \qquad \text{Expression 1}$$

Meanwhile, "m" represents the mass, and "C" represents the compliance.

Since the compliance is the mechanical rigidity of the piezoelectric vibrators 111 to 113, the fundamental resonance frequency can be controlled by controlling the rigidity of the piezoelectric substance 114.

For example, the fundamental resonance frequency can be caused to shift to a low pass by selecting a material having a high elastic modulus or reducing the thickness of the elastic member 115. On the other hand, the fundamental resonance frequency can be caused to shift to a high pass by selecting a material having a high elastic modulus or increasing the thickness of the elastic member 115.

There has been a problem in restriction on the design, costs, reliability and the like since the fundamental resonance frequency has been controlled through the shape or material of the piezoelectric substance 114. On the other hand, in the embodiment, the fundamental resonance frequency can be easily adjusted to a desired value by changing the elastic member 115 which is a configuration member.

Meanwhile, the material constituting the elastic member 115 is not particularly limited as long as it is a material, such as metal or resin, having a high elastic modulus with respect to ceramic, which is a brittle material, but is preferably a general-purpose material such as phosphor bronze or stainless steel from the viewpoint of workability or costs.

In addition, the thickness of the elastic member 115 is preferably equal to or more than 5 μm, and equal to or less than 1,000 μm. When the thickness of the elastic member 115 is less than 5 μm, the mechanical strength is weak, and thus a function as a constraint member could be damaged. In addition, an error in the mechanical vibration characteristics of the piezoelectric substance 114 among manufacturing lots occurs due to the deterioration in the processing accuracy of the elastic member 115.

In addition, when the thickness of the elastic member 115 exceeds 1,000 μm, the constraint on the piezoelectric substance 114 due to an increase in rigidity is intensified, and thus there is a problem in that the attenuation of the amount of vibration displacement is caused. In addition, in the elastic member 115 of the embodiment, the modulus of longitudinal elasticity which is an index indicating the rigidity of a material is preferably equal to or more than 1 GPa, and equal to or less than 500 GPa. As mentioned above, when the rigidity of the elastic member 115 is excessively low or excessively high, the characteristics or reliability as a mechanical vibrator could be damaged.

The material of the vibrator support mechanism 120 is not particularly limited, but is preferably a material having a higher rigidity than that of the elastic member 115 and the piezoelectric substance 114. For example, the vibrator support mechanism 120 is formed of brass or the like. In addition, the material may be formed of the same material as that of the body housing 130, and the vibrator support mechanism may be formed integrally with the body housing 130.

Next, the operation principle of the electro-acoustic transducer 100 according to the embodiment will be described. The electro-acoustic transducer 100 according to the embodiment generates a highly directional sound wave from a plurality of piezoelectric vibrators 111 to 113.

The electro-acoustic transducer 100 according to the present invention includes a plurality of piezoelectric vibrators 111 to 113 divided by the vibrator support mechanisms 120, and the plurality of piezoelectric vibrators 111 to 113 are constituted by the elastic member 115 and the piezoelectric substance 114, both ends of which are fixed by the vibrator support mechanisms 120.

The plurality of piezoelectric vibrators 111 to 113 oscillate an ultrasonic wave (of which frequency band is equal to or less than 20 kHz, for example) obtained by modulating an audible sound. The modulated ultrasonic wave is demodulated into an audible sound in the air. The ultrasonic wave herein is a modulated wave transporter, and the frequency thereof is, for example, 100 KHz.

The plurality of piezoelectric vibrators 111 to 113 emit into the air ultrasonic waves on which, for example, an AM modulation, a double sideband modulation (DSB) modulation, a single-sideband modulation (SSB) modulation, or a frequency modulation (FM) modulation is performed. An audible sound then emerges due to the non-linear characteristics when the ultrasonic waves are propagated into the air.

An example of the non-linear characteristics includes a phenomenon in which a transition from a laminar flow to a turbulent flow occurs when the Reynolds number expressed by the ratio of the inertial action and the viscous action of a flow increases.

Since the sound wave is very slightly disturbed within a fluid, the sound wave is propagated non-linearly. Although the amplitude of the sound wave in a low-frequency band is non-linear, the sound wave has a very small amplitude difference, and thus is normally treated as a phenomenon in a linear theory. On the other hand, the non-linearity can be easily observed in the ultrasonic waves. When the ultrasonic waves are emitted into the air, higher harmonic waves based on the non-linearity are conspicuously generated.

The sound wave is a sparse and dense wave in which the sparse molecular assemblies and dense molecular assemblies coexist in the air. When it takes time for air molecules to be restored rather than compressed, the air which is not capable of being restored after the compression collides with air molecules continuously propagated. Thereby, a shock wave occurs and thus an audible sound is generated.

The piezoelectric substance 114 has a high mechanical quality factor Q (hereinafter, called the mechanical Q). For this reason, in the piezoelectric vibrators 111 to 113, energy is concentrated in the vicinity of the fundamental resonance frequency, and an output is high in the vicinity of the resonance frequency. However, in other bands, the output of the piezoelectric vibrators 111 to 113 is considerably attenuated.

However, the piezoelectric vibrators 111 to 113 generate a sound wave at a single frequency. For this reason, when the mechanical Q of the piezoelectric substance 114 increases, the sound pressure level of the sound wave which is output by the piezoelectric vibrators 111 to 113 increases. Therefore, when the piezoelectric vibrators 111 to 113 are used, the electro-mechanical conversion efficiency increases.

Meanwhile, as shown in the drawings, in the embodiment, the plurality of piezoelectric vibrators 111 to 113 output highly directional sound waves in the directions different from each other. The plurality of highly directional sound waves intersects each other in the inside of the body housing 130, but do not intersect each other in a focal position in which demodulation into audible range sound waves is performed.

For this reason, ultrasonic waves can be demodulated into audible range sound waves at a desired position without being unintentionally demodulated due to the interference of the intersection. The electro-acoustic transducer 100 according to the embodiment can output highly directional sound waves demodulated into audible range sound waves at a desired position in a plurality of directions. In addition, it is possible to output a highly directional sound more extensively than an existing parametric speaker in which a plurality of piezoelectric vibrators is arranged in a matrix.

Further, in the electro-acoustic transducer 100 according to the embodiment, it is also possible to adjust the fundamental resonance frequency of each of the piezoelectric vibrators 111 to 113 by changing the areas of the plurality of piezoelectric vibrators 111 to 113 by adjusting the positions of the piezoelectric vibrators 111 to 113 during the manufacturing of the electro-acoustic transducer 100.

For this reason, a desired fundamental resonance frequency can be easily given to each of the plurality of piezoelectric vibrators 111 to 113. Bands having a low sound pressure level can be complemented to each other by simultaneously driving the piezoelectric vibrators 111 to 113 having fundamental resonance frequencies different from each other.

Meanwhile, in the electro-acoustic transducer 100 according to the embodiment, the highly directional sound waves which are output by the plurality of piezoelectric vibrators 111 to 113 intersect each other. It is possible to amplify or reduce the demodulated audible range sound waves by leveraging the interference due to this intersection. In addition, it is also possible to cause a position in which the audible range sound waves are demodulated to fluctuate.

In addition, it is possible to achieve stereophony in an audible sound reproduction using the ultrasonic waves, since the sound waves are generated from the plurality of piezoelectric vibrators 111 to 113.

Moreover, in the electro-acoustic transducer 100 according to the embodiment, a laminated body in which a sheet of piezoelectric substance 114 and a sheet of elastic member 115 are integrally bonded to each other is constrained by the plurality of vibrator support mechanisms 120, to thereby form the plurality of piezoelectric vibrators 111 to 113. For this reason, the structures of the piezoelectric vibrators 111 to 113 are simplified, and productivity is high. In addition, it is easy to equalize the frequency characteristics of the plurality of piezoelectric vibrators 111 to 113.

The electro-acoustic transducer 100 according to the embodiment can also be used as a sound source of the electronic device (for example, a cellular phone, a note-type personal computer, a small-sized game machine or the like). In this case, it is possible to suppress an increase in size of the electro-acoustic transducer 100, and to improve the acoustic characteristics. The electro-acoustic transducer 100 is, for example, a portable electronic device.

Meanwhile, the present invention is not limited to the above-mentioned embodiment and example, and various changes can be made without departing from the scope of the invention. For example, in the electro-acoustic transducer 100 having the above-mentioned configuration, it is considered that the plurality of piezoelectric vibrators 111 to 113 is divided into the same size. However, such a plurality of piezoelectric vibrators 111 to 113 may be different from each other in size (not shown in figures).

In addition, in the above-mentioned configuration, the plurality of piezoelectric vibrators 111 to 113 of which the directions are different from each other is exemplified. However, each of the plurality of piezoelectric vibrators of which the directions are different from each other may be formed as a parametric speaker in a matrix array, and the output direction of the highly directional sound wave may be deflected (not shown in figures).

In addition, in the electro-acoustic transducer 100 having the above-mentioned configuration, it is exemplified that the plurality of piezoelectric vibrators 111 to 113 is fixed by the plurality of vibrator support mechanisms 120, and the highly directional sound wave are output in a plurality of fixed directions.

Figure 2:
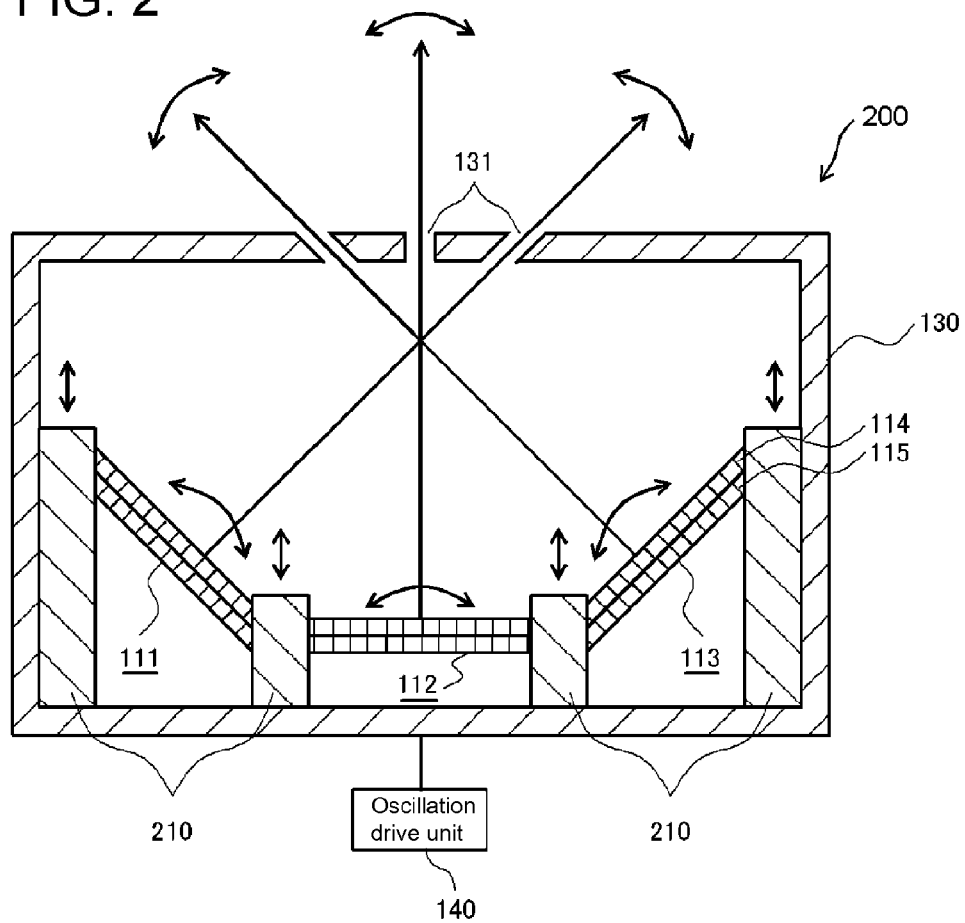
FIG. 2 is a vertical cross-sectional front view schematically illustrating a structure of an electro-acoustic transducer which is an oscillator according to a modified example.

However, as in an electro-acoustic transducer 200 exemplified as an oscillator in FIG. 2, the plurality of piezoelectric vibrators 111 to 113 may be supported by the vibrator support mechanisms 210 (sound deflection units). The vibrator support mechanism 210 is vertically expansible, and is formed of, for example, a piezoelectric element or the like. In this case, the deflection directions of the plurality of piezoelectric vibrators 111 to 113 can be changed.

In the electro-acoustic transducer 200, data indicating a relationship between the direction of the three piezoelectric vibrators 111 to 113 and the expansible states of the four vibrator support mechanisms 210 is stored in the oscillation drive unit 140. When the piezoelectric vibrators 111 to 113 are deflected, at least one of the four vibrator support mechanisms 210 is expanded or contracted on the basis of registered data thereof. In the electro-acoustic transducer 200, as mentioned above, since the directions of the plurality of piezoelectric vibrators 111 to 113 can be changed, it is possible to change the directions of the highly directional sound waves to be output.

Figure 3:
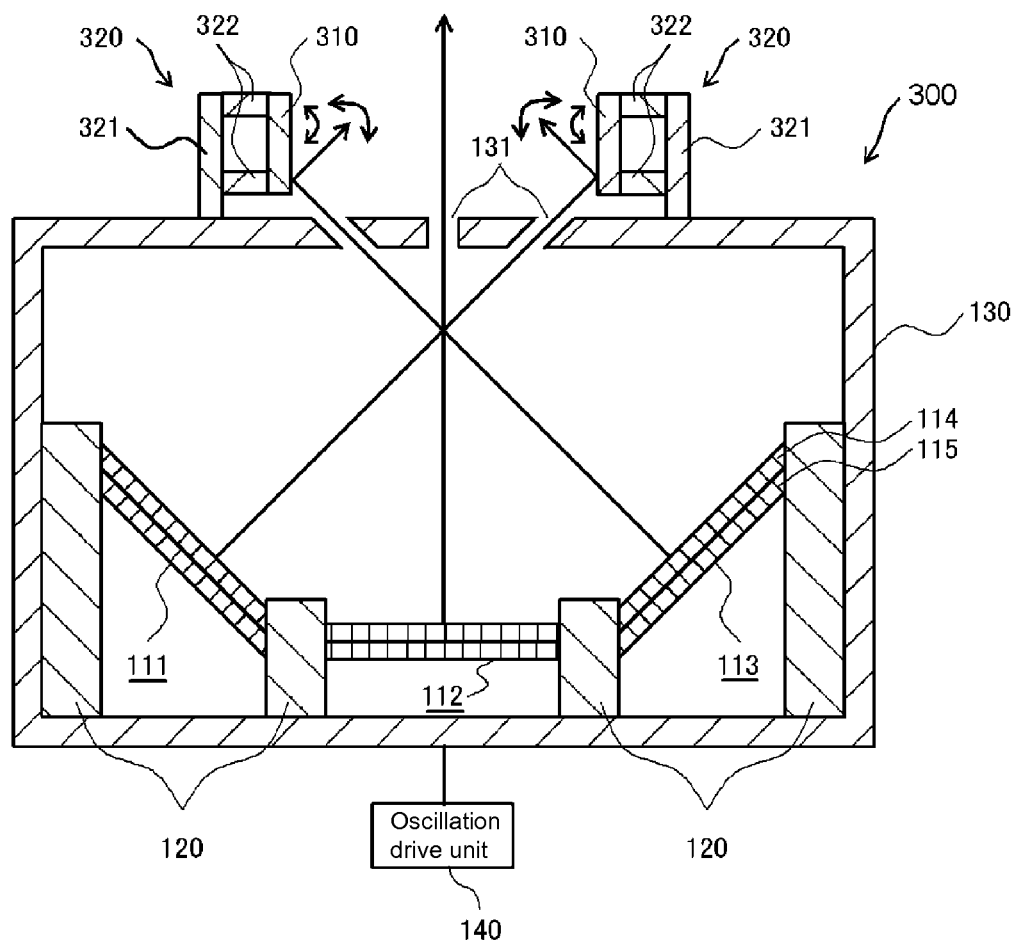
FIG. 3 is a vertical cross-sectional front view schematically illustrating a structure of an electro-acoustic transducer which is an oscillator according to another modified example.

In addition, as in an electro-acoustic transducer 300 exemplified as an oscillator in FIG. 3, a sound deflection unit may include, for example, a sound reflection member 310 and a reflection-variable mechanism 320 that deflects the sound reflection member 310. The sound reflection member 310 reflects highly directional sound waves which are output from the piezoelectric vibrators 111 and 113 on both sides.

Such a reflection-variable mechanism 320 includes, for example, a support strut 321 and a piezoelectric element 322. The support strut 321 is attached to the upper surface of the body housing. The piezoelectric element 322 is attached to the upper end of the support strut 321 and the portion thereunder so as to be expansible in the transverse direction. The sound reflection member 310 is attached to the open end of the piezoelectric element 322.

In the electro-acoustic transducer 300, as mentioned above, since the direction of the sound reflection member 310 that reflects the highly directional sound waves which are output from the plurality of piezoelectric vibrators 111 to 113 can be changed, it is possible to change the directions of the highly directional sound waves to be reflected.

Meanwhile, of course, the sound reflection member 310 and the reflection-variable mechanism 320 mentioned above may be disposed in positions on which the highly directional sound waves are incident, and may be disposed, for example, in the inside of the body housing 130 (not shown in figures).

Further, as in an electro-acoustic transducer 400 exemplified as an oscillator in FIG. 4, the sound deflection unit may include a sound transmission member 410. The sound transmission member 410 is provided for each of the plurality of piezoelectric vibrators 111 to 113. The sound transmission member 410 transmits the highly directional sound waves which are output from the piezoelectric vibrators 111 to 113. The direction of the sound transmission member 410 is adjusted with a transmission-variable mechanism.

For example, the sound transmission member 410 is cylindrical, and is pivotally supported to the top plate of the body housing 130 so as to be capable of being rotated. A hollow portion of the cylinder is a sound hole 411, and is taper-shaped. The transmission-variable mechanism is constituted by a solenoid, a stepping motor or the like, and rotates the sound transmission member 410.

In the electro-acoustic transducer 400, data indicating a relationship between the output direction of the highly directional sound wave and the angle of rotational movement of the sound transmission member 410 is registered in the oscillation drive unit 140. When the output direction of the highly directional sound wave is changed, at least one of the three sound transmission members 410 is rotated on the basis of the registered data.

In the electro-acoustic transducer 400, since the direction of the sound transmission member 410 can be changed, it is possible to change the direction of the highly directional sound wave passing through the sound hole 411.

Moreover, the sound hole 411 of the sound transmission member 410 is formed in a taper shape in which the incident direction is widely opened. For this reason, as mentioned above, even when the sound transmission member 410 is rotated, it is possible to cause the highly directional sound wave to be incident on the sound hole.

Further, in the above-mentioned configuration, it is exemplified that electrode layers are uniformly formed on the entireties of the upper surface and the lower surface of the piezoelectric substance 114. However, the electrode layer may be formed individually for each of the plurality of piezoelectric vibrators 111 to 113 (not shown in figures).

In addition, in the above-mentioned configuration, it is exemplified that a laminated body of one piezoelectric substance 114 and one elastic member 115 is constrained by the vibrator support mechanisms 120, to thereby form the plurality of piezoelectric vibrators 111 to 113. However, the piezoelectric vibrators which are formed individually from the beginning may be supported by the vibrator support mechanisms (not shown in figures).

Further, in the above-mentioned configuration, it is exemplified that the three piezoelectric vibrators 111 to 113 are disposed in a concave shape. However, the plurality of piezoelectric vibrators 111 to 113 may be disposed in a convex shape, and the number of piezoelectric vibrators may be two, and may be four or more (not shown in figures).

In addition, in the above-mentioned configuration, the electro-acoustic transducer 100 and the like are exemplified as an oscillator. Such an electro-acoustic transducer 100 and the like can be mounted to, for example, a cellular phone which is an electrical device.

Further, as an electronic device, a sonar (not shown in figures) or the like can be implemented, which is an oscillator and includes the electro-acoustic transducer 100 or the like that generates ultrasonic waves, an oscillation drive unit that drives the electro-acoustic transducer 100 or the like, an ultrasonic wave detection unit that detects the ultrasonic waves reflected from an object to be measured, and a distance calculation unit that calculates a distance to the object to be measured as a result of the detection with the ultrasonic wave detection unit.

Meanwhile, a plurality of embodiments and a plurality of modified examples mentioned above can be naturally combined in the range consistent with the contents thereof. In addition, in the embodiment and modified examples mentioned above, although the structure and the like of each part have been specifically described, it is possible to variously change the structure and the like in the range that satisfies the present invention.

The invention claimed is:

1. An oscillator comprising:
   a first piezoelectric vibrator which outputs a first sound wave in a first direction;
   a second piezoelectric vibrator which outputs a second sound wave in a second direction; and
   a vibrator support mechanism that supports the first and second piezoelectric vibrators so that the first and second directions are different from each other;
   wherein the first and second directions intersect in a housing of the oscillator.

2. The oscillator according to claim 1, wherein a laminated body of a piezoelectric substance and an elastic member is formed, and
   the vibrator support mechanism divides the laminated body into at least the first and second piezoelectric vibrators.

3. The oscillator according to claim 1, further comprising a sound deflection unit that deflects a sound wave which is output by at least one of the piezoelectric vibrators.

4. The oscillator according to claim 3, wherein the sound deflection unit includes at least one sound reflection unit that reflects a sound wave to be changed and a reflection-variable unit that changes a direction of the sound reflection unit.

5. The oscillator according to claim 3, wherein the sound deflection unit includes at least one sound transmission unit that transmits a sound wave to be changed and a transmission-variable unit that changes a direction of the sound transmission unit.

6. The oscillator according to claim 3, wherein the sound deflection unit includes a sound wave change unit that changes the direction of at least one of the first and second piezoelectric vibrators.

7. The oscillator according to claim 1, wherein the first and second piezoelectric vibrators output highly directional sound waves obtained by modulating a low-frequency audible range sound into ultrasonic waves, and
   the vibrator support mechanism supports the first and second piezoelectric vibrators so that positions in which the highly directional sound waves are demodulated into the audible range sound waves are different from each other.

8. The oscillator according to claim 1, wherein the first and second piezoelectric vibrators output highly directional sound waves of ultrasonic waves, and
   the vibrator support mechanism supports the first and second piezoelectric vibrators so that positions from which the highly directional sound waves are reflected are different from each other.

9. An electronic device comprising:
   the oscillator according to claim 1; and
   an oscillation drive unit that causes the oscillator to output a highly directional sound wave that is obtained by modulating a low-frequency audible range sound into ultrasonic waves.

10. An electronic device comprising:
   the oscillator according to claim 1;
   an oscillation drive unit that drives the oscillator to output ultrasonic waves;
   an ultrasonic wave detection unit that detects the ultrasonic waves reflected from an object to be measured; and
   a distance calculation unit that calculates a distance to the object to be measured on the basis of the ultrasonic waves detected by the ultrasonic wave detection unit.

* * * * *